(12) United States Patent
Park et al.

(10) Patent No.: US 11,037,608 B2
(45) Date of Patent: Jun. 15, 2021

(54) STACKED MEMORY DEVICE AND MEMORY SYSTEM INCLUDING THE SAME

(71) Applicant: SK hynix Inc., Gyeonggi-do (KR)

(72) Inventors: Myeong-Jae Park, Gyeonggi-do (KR); Chun-Seok Jeong, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 6 days.

(21) Appl. No.: 16/677,289

(22) Filed: Nov. 7, 2019

(65) Prior Publication Data

US 2020/0202910 A1 Jun. 25, 2020

(30) Foreign Application Priority Data

Dec. 24, 2018 (KR) ........................ 10-2018-0168378

(51) Int. Cl.
| | |
|---|---|
| *G11C 5/14* | (2006.01) |
| *G11C 7/10* | (2006.01) |
| *H01L 23/00* | (2006.01) |
| *G11C 7/22* | (2006.01) |
| *H01L 25/065* | (2006.01) |

(52) U.S. Cl.
CPC .......... *G11C 7/1087* (2013.01); *G11C 7/1093* (2013.01); *G11C 7/222* (2013.01); *H01L 24/14* (2013.01); *H01L 25/0657* (2013.01); *H01L 2224/1403* (2013.01)

(58) Field of Classification Search
CPC ...... G11C 7/1087; G11C 7/1093; G11C 7/222
USPC ....................................................... 365/189.09
See application file for complete search history.

(56) References Cited

U.S. PATENT DOCUMENTS

| | | | | |
|---|---|---|---|---|
| 2011/0317495 A1* | 12/2011 | Ishikawa | ................. | G11C 7/22 365/189.03 |
| 2019/0007243 A1* | 1/2019 | Burbano | ................. | H03K 7/04 |

FOREIGN PATENT DOCUMENTS

| | | |
|---|---|---|
| KR | 10-2004-0093858 | 11/2004 |
| KR | 10-2009-0045495 | 5/2009 |

* cited by examiner

*Primary Examiner* — Vu A Le
(74) *Attorney, Agent, or Firm* — IP & T Group LLP (57) ABSTRACT

A stacked memory device includes: a plurality of semiconductor chips that are stacked and transfer signals through a plurality of through-electrodes, wherein at least one of the semiconductor chips comprises: a re-timing circuit suitable for receiving input signals and first and second clocks, performing a re-timing operation of latching the input signals based on the second clock to output re-timed signals, and reflecting a delay time of the re-timing operation into the first clock to output a replica clock; and a transfer circuit suitable for transferring the re-timed signals to the through-electrodes based on the replica clock.

21 Claims, 9 Drawing Sheets

STACKED MEMORY DEVICE AND MEMORY SYSTEM INCLUDING THE SAME

CROSS-REFERENCE TO RELATED APPLICATIONS

The present application claims priority of Korean Patent Application No. 10-2018-0168378, filed on Dec. 24, 2018, which is incorporated herein by reference in its entirety.

BACKGROUND

1. Field

Exemplary embodiments of the present invention relate to semiconductor design technology, and more particularly, to a stacked memory device supporting a direct access mode.

2. Description of the Related Art

As the semiconductor technology makes a dramatic progress, semiconductor integrated devices as a package are also required to have higher integration degree and higher performance. To this end, getting away from a two-dimensional structure in which semiconductor chips are arranged on one plane over a printed circuit board (PCB) by using wires or bumps, diverse technologies related to a three-dimensional structure in which a plurality of semiconductor chips are vertically stacked are emerging.

The three-dimensional structure may be embodied through a stacked memory device in which a plurality of semiconductor chips are vertically stacked. The semiconductor chips stacked in a vertical direction are electrically connected to each other through through-electrodes (e.g., through-silicon-vias, TSVs) and mounted on a semiconductor packaging substrate for packaging a semiconductor.

Clock-based circuits in the stacked memory device are required to transfer externally input signals at a correct timing, particularly with securing setup/hold margin.

SUMMARY

Embodiments of the present invention are directed to a stacked memory device with improved reliability.

In accordance with an embodiment of the present invention, a stacked memory device includes: a plurality of semiconductor chips that are stacked and transfer signals through a plurality of through-electrodes, wherein at least one of the semiconductor chips comprises: a re-timing circuit suitable for receiving input signals and first and second clocks, performing a re-timing operation of latching the input signals based on the second clock to output re-timed signals, and reflecting a delay time of the re-timing operation into the first clock to output a replica clock; and a transfer circuit suitable for transferring the re-timed signals to the through-electrodes based on the replica clock.

In accordance with an embodiment of the present invention, a memory system includes: a stacked memory device including a plurality of semiconductor chips that are stacked and transfer signals through a plurality of through-electrodes; and a memory controller including an interface suitable for transferring/receiving data with the semiconductor chips, wherein at least one of the semiconductor chips comprises: a re-timing circuit suitable for receiving input signals and first and second clocks, performing a re-timing operation of latching the input signals based on the second clock to output re-timed signals, and reflecting a delay time of the re-timing operation into the first clock to output a replica clock; and a transfer circuit suitable for transferring the re-timed signals to the through-electrodes based on the replica clock.

In accordance with an embodiment of the present invention, a method for operating a stacked memory device including a plurality of semiconductor chips that are stacked and transfer signals through a plurality of through-electrodes, includes: receiving input signals and first and second clocks in at least one of the semiconductor chips; outputting re-timed signals by performing a re-timing operation of latching the input signals based on the second clock to output re-timed signals; outputting a replica clock by reflecting a delay time of the re-timing operation into the first clock; and transferring the re-timed signals to the through-electrodes based on the replica clock.

In accordance with an embodiment of the present invention, a semiconductor apparatus includes: a re-timing circuit configured to align an input signal, which is originally in synchronization with a first clock, based on a second clock and delay the first clock by an amount of time for the aligning of the input signal; and an output circuit configured to output the aligned input signal in synchronization with the delayed first clock, wherein the first and second clocks have a single period with a variable phase difference.

In accordance with an embodiment of the present invention, an operation method of a semiconductor apparatus includes: aligning an input signal, which is originally in synchronization with a first dock, based on a second clock; delaying the first clock by an amount of time for the aligning of the input signal; and outputting the aligned input signal in synchronization with the delayed first clock, wherein the first and second clocks have a single period with a variable phase difference.

In accordance with an embodiment of the present invention, a stacked memory device includes: a base logic die; and a plurality of semiconductor chips that are stacked over the base logic die and transfer signals through a plurality of through-electrodes, wherein the base logic die includes a physical area suitable for interfacing with a memory controller, a through-electrode area suitable for interfacing with the plurality of through-electrodes, and a direct access area suitable for directly interfacing with an external device, and wherein the physical area includes: a re-timing circuit suitable for receiving input signals transferred from the direct access area and first and second clocks, performing a re-timing operation of latching the input signals based on the second clock to output re-timed signals, and reflecting a delay time of the re-timing operation into the first clock to output a replica dock; and a transfer circuit suitable for transferring the re-timed signals to the plurality of through-electrodes based on the replica clock.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

As used herein, singular forms may include the plural forms as well and vice versa, unless the context clearly indicates otherwise. The articles 'a' and 'an' as used in this application and the appended claims should generally be construed to mean 'one or more' unless specified otherwise or clear from context to be directed to a singular form.

Hereinafter, a memory system including a stacked memory device will be described. The memory system in accordance with the embodiment of the present invention may be embodied in the form of a system-in-package, a multi-chip package, or a system-on-chip, and it may also be embodied in the form of a package-on-package.

Figure 1:
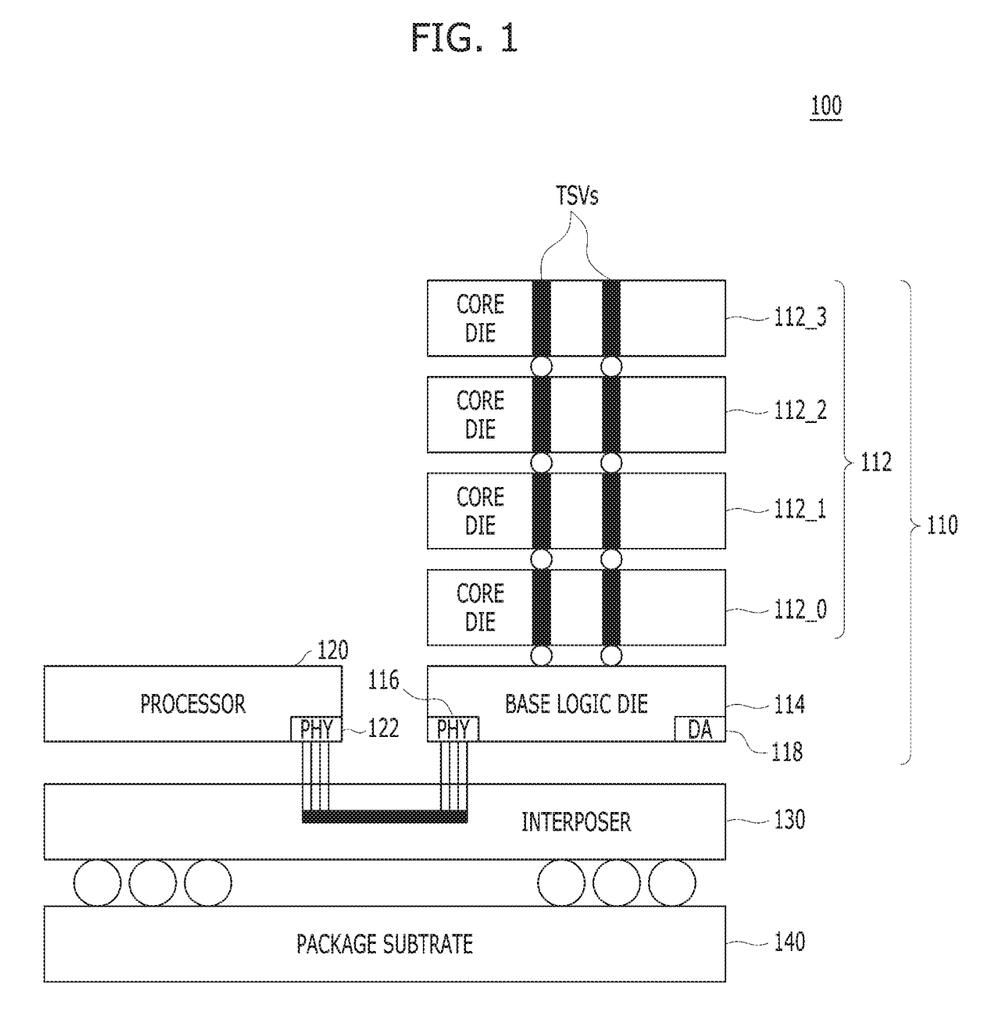
FIG. 1 is a cross-sectional diagram illustrating a memory system in accordance with an embodiment of the present invention.

FIG. 1 is a cross-sectional diagram illustrating a memory system 100 in accordance with an embodiment of the present invention.

Referring to FIG. 1, the memory system 100 may include a stacked memory device 110, a memory controller (processor) 120, an interposer 130, and a package substrate 140.

The interposer 130 may be mounted onto the package substrate 140.

The stacked memory device 110 and the memory controller 120 may be mounted onto the interposer 130.

Since the memory controller 120 is generally included in diverse processors, such as a Central Processing Unit (CPU), a Graphic Processing Unit (GPU), and an Application Processor (AP), the memory controller 120 may be also referred to as a processor as designated in FIG. 1.

A physical area (PHY) 116 of the stacked memory device 110 may be coupled to a physical area (PHY) 122 of the memory controller 120 via the interposer 130. An interface circuit for communication between the stacked memory device 110 and the memory controller 120 may be disposed in each of the physical areas 116 and 122.

The stacked memory device 110 may form a High Bandwidth Memory (HBM). The HBM may have the high bandwidth corresponding to the increased number of I/O units obtained by stacking a plurality of dies (i.e., semiconductor chips) in a vertical direction and electrically connecting them through through-electrodes TSVs.

The dies may include a base logic die 114 and a plurality of core dies 112. The core dies 112 may be stacked over the base logic die 114, and coupled to each other through the through-electrodes TSVs. Although the embodiment of FIG. 1 shows a case where four core dies 112, that is, first to fourth core dies 112_0 to 112_3, are stacked, the concept and spirit of the present invention are not limited thereto and the number of the stacked core dies may vary depending on the design of the semiconductor memory device.

Each of the core dies 112 may have a plurality of memory cells for storing data and circuits for supporting a core operation on the memory cells. The base logic die 114 may interface between the core dies 112 and the memory controller 120 so that various functions within the memory system 100, such as a memory management function (e.g., a refresh management function and a power management function for the memory cells), and a timing adjustment function between the core dies 112 and the memory controller 120, may be performed.

Meanwhile, the base logic die 114 may include a physical area 116 and a direct access area (DA) 118. In the physical area 116, an interface circuit for communication with the memory controllers 120 may be disposed. In the direct access area 118, an interface circuit for directly testing the stacked memory device 110 may be disposed. The base logic die 114 is also referred to as a buffer die.

Figure 2:
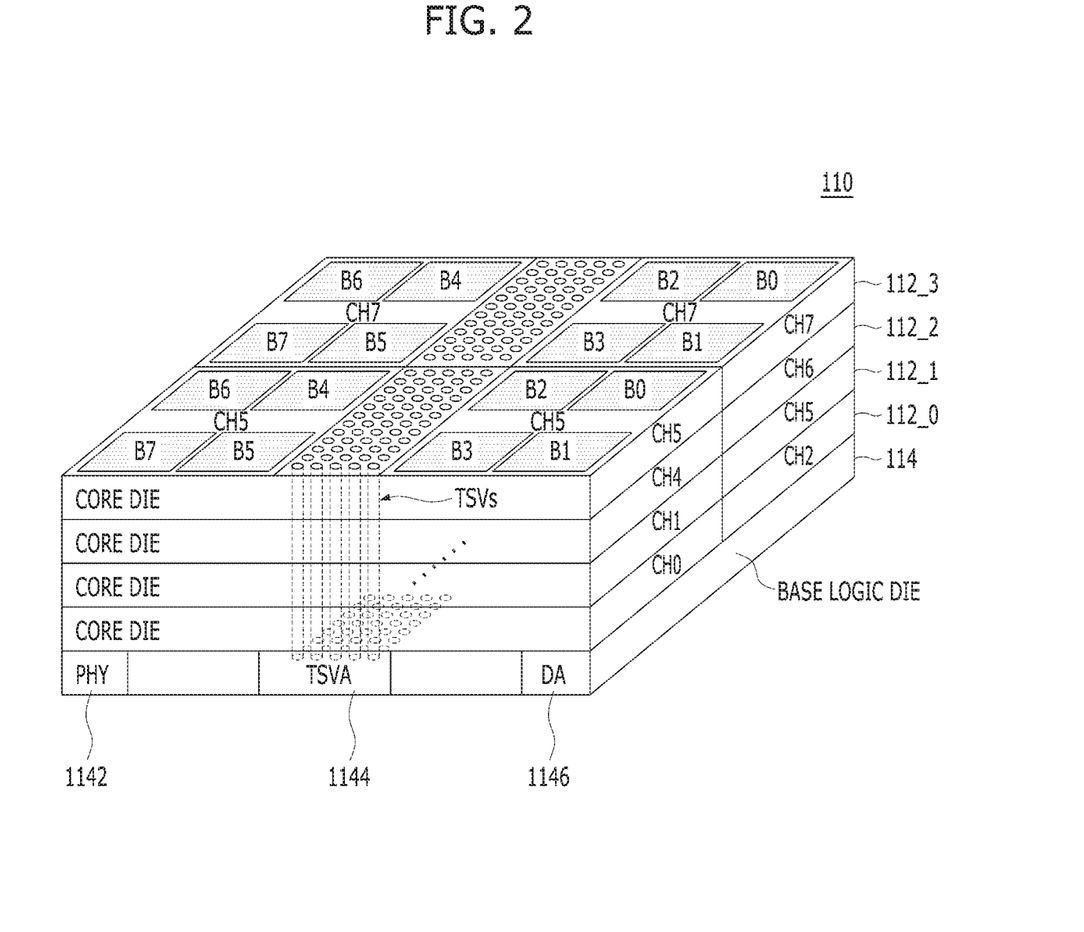
FIG. 2 is a perspective view of a stacked memory device shown in FIG. 1.

FIG. 2 is a perspective view of the stacked memory device 110 shown in FIG. 1.

Referring to FIG. 2, each of the first to fourth core dies 112_0 to 112_3 may include one or more channels. In the example of FIG. 2, as one core die includes two channels, the stacked memory device 110 may have first to eighth channels CH0 to CH7. For example, the first core die 112_0 may include memory areas corresponding to the first and third channels CH0 and CH2, and the second core die 112_1 may include memory areas corresponding to the second and fourth channels CH1 and CH3. The third core die 112_2 may include memory areas corresponding to the fifth and seventh channels CH4 and CH6, and the fourth core die 112_3 may include memory areas corresponding to the sixth and eighth channels CH5 and CH7.

For example, first to eighth memory banks B0 to B7 may correspond to each channel. Further, a plurality of through-electrodes TSVs passing through the first to fourth core dies 112_0 to 112_3 may be disposed corresponding to the first to eighth channels CH0 to CH7, respectively. When each channel has a bandwidth of 128 bits (i.e., two 128-bit channels per die), the through-electrodes TSVs and corresponding I/O units may result into the stacked memory device 110 with a 1024-bit interface. Each channel may be similar to a standard DDR interface, but may be completely independent and therefore each channel within one stacked memory device and even within one die may operate at different frequency and/or different timings.

The base logic die 114 may communicate with the memory controller 120 (see FIG. 1). For example, the base logic die 114 may receive commands, addresses, and data from the memory controller 120, and provide the received commands, addresses, and data to the first to fourth core dies 112_0 to 112_3.

A physical area (PHY) 1142, a TSV area (TSVA) 1144, and a direct access area (DA) 1146 may be disposed in the base logic die 114. The physical area (PHY) 1142 may be the same part as the physical area (PHY) 116 shown in FIG. 1, and the direct access area (DA) 1146 may be the same part as the direct access area (DA) 118.

The physical area 1142 may be provided with an I/O circuit for interfacing with the memory controller 120. The physical area 1142 may be disposed in a first edge area of the base logic die 114, adjacent to the memory controller 120. The direct access area 1146 may be provided with an I/O circuit for direct interfacing with an external test device (not shown). The direct access area 1146 may be disposed in a second edge area of the base logic die 114, adjacent to the external test device. The second edge area may be in a direction which is opposite to the first edge area. The TSV area (TSVA) 1144 may be an area for interfacing with the through-electrodes TSVs passing through the first to fourth core dies 112_0 to 112_3. The TSV area 1144 may be disposed between the physical area 1142 and the direct access area 1146, that is, the TSV area 1144 may be disposed at the central area of the base logic die 114.

The physical area 1142 may transfer signals received from the memory controller 120 to the TSV area 1144. The direct access area 1146 may transfer a test signal received from the external test device to the TSV area 1144. The TSV area 1144 may perform a predetermined signal processing operation, for example, a buffering operation, on the signal received from the physical area 1142 or the test signal received from the direct access area 1146 so as to transfer the buffered signals to the first to fourth core dies 112_0 to 112_3 through the through-electrodes TSVs.

Figure 3:
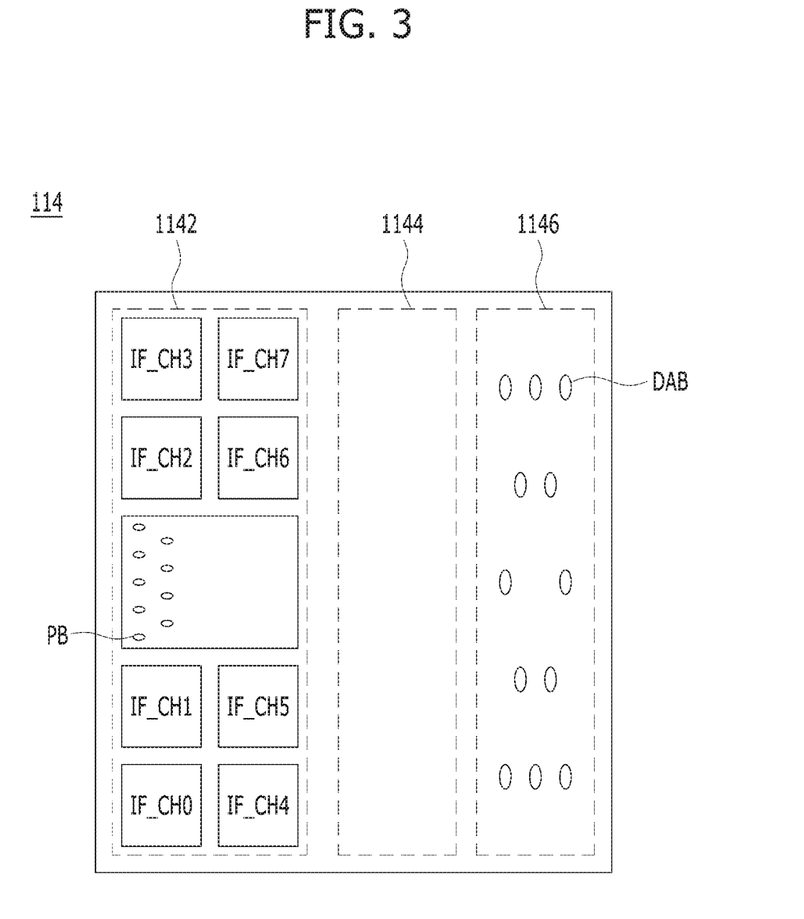
FIG. 3 is a plan view of a base logic die shown in FIG. 2.

FIG. 3 is a plan view of the base logic die 114 shown in FIG. 2.

Referring to FIG. 3, the physical area 1142, the TSV area 1144, and the direct access area 1146 may be disposed in the base logic die 114. channel interface areas IF_CH0 to IF_CH7 for interfacing with the first to eighth channels CH0 to CH7 of the first to fourth core dies 112_0 to 112_3 may be disposed in the physical area 1142.

A plurality of PHY bumps PB for interfacing with the memory controller 120 may be formed in the physical area 1142, A plurality of direct access bumps DAB may be formed in the direct access area 1146 for the external test device to direct access (e.g., probe) and test the stacked memory device 110 without going through the interposer 130. The PHY bumps PB may be formed of micro bumps, and direct access bumps DAB may be formed of C4 bumps which are larger than micro bumps. For example, micro bumps may be formed in a size of approximately 2 μm to approximately 40 μm, and the C4 bumps may be formed in a size larger than 40 μm and 120 μm or smaller.

As described above, it is practically difficult to test the stacked memory device 110 by using the PHY bumps PB because the physical size of the PHY bumps PB is very small and the number of the PHY bumps PB is very large, that is, approximately 1000 or more. It is even more difficult to test the stacked memory device 110 by using the PHY bumps PB when the stacked memory device 110 communicates with the memory controller 120 in the form of a System-In-Package (SIP). For this reason, memory devices may be tested by using direct access bumps DAB that are relatively larger in the physical size and relatively fewer in the number than PHY bumps (PB).

In addition, a system vendor may require a mode of directly inputting data to a core die without going through the memory controller 120 in order to evaluate only the characteristics of the memory areas of the respective core dies 112_0 to 112_3. In short, a test operation may be performed by entering a direct access (DA) mode to test memory cells in a memory area corresponding to each channel. In the direct access mode, a test signal may be applied through the direct access bumps DAB of the direct access area 1146, and the applied test signal may be supplied to each of the core dies 112_0 to 112_3 through the through-electrodes TSVs of the TSV area 1144.

In the direct access mode, a test signal applied through the direct access bumps DAB of the direct access area 1146 may be transferred to the physical area 1142, and the test signal may be transferred to the through-electrodes TSVs of the TSV area 1144 through the interface circuit of the channel interface areas IF_CH0 to IF_CH7 included in the physical area 1142. Herein, there is a high possibility that skew may occur between a command/address/data and a clock/strobe signal because the physical area 1142 is physically far away from the direct access bumps DAB. Therefore, it is needed to transfer a signal at an exact timing between the direct access area 1146 and the physical area 1142.

Hereinafter, a method of transferring a test signal applied through the direct access bumps DAB of the direct access area 1146 to the physical area 1142 at an exact timing will be discussed. For the sake of convenience in explanation, an example in which the stacked memory device 110 is provided with the first to eighth channels CH0 to CH7 as one core die includes two channels is presented.

Figure 4:
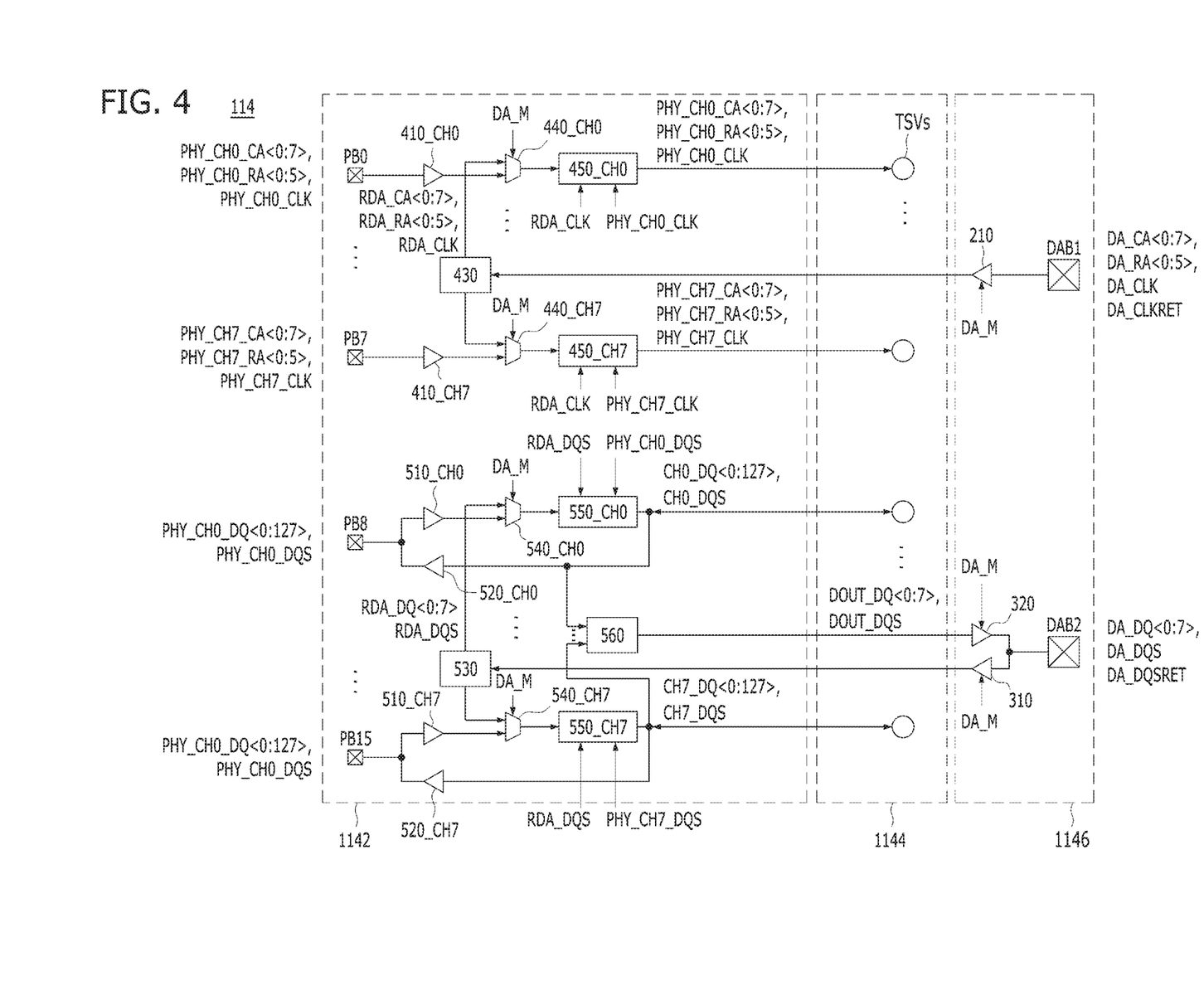
FIG. 4 is a detailed circuit diagram of the base logic die shown in FIG. 3.

FIG. 4 is a detailed circuit diagram of the base logic die 114 shown in FIG. 3.

Referring to FIG. 4, as described above, the physical area 1142, the TSV area 1144, and the direct access area 1146 may be disposed in the base logic die 114.

A first direct access bump DAB1, a second direct access bump DAB2, a first receiver 210, a second receiver 310, and a first transmitter 320 may be disposed in the direct access area 1146. The first direct access bump DAB1 may be a bump for inputting a command DA_CA<0:7>, an address DA_RA<0:5>, a first direct access clock DA_CLK, and a second direct access clock DA_CLKRET therethrough, in the direct access mode, The second direct access bump DAB2 may be a bump for inputting and outputting data DA_DQ<0:7>, a first strobe signal DA_DQS, and a second strobe signal DA_DQSRET therethrough, in the direct access mode.

The first direct access clock DA_CLK and the second direct access clock DA_CLKRET may same the same period (i.e., the same frequency) and a predetermined phase difference. The first strobe signal DA_DQS and the second strobe signal DA_DQSRET may have the same period (i.e., the same frequency) and a predetermined phase difference. The first direct access clock DACLK and the first strobe signal DA_DQS may be clocks provided for test operations of core dies, and the second direct access clock DA_CLKRET and the second strobe signal DA_DQSRET may be clocks provided for a re-timing operation of the base logic die 114, which will be described hereafter.

Hereinafter, the command DA_CA<0:7> and the address DA_RA<0:5> may be collectively defined as 'control signals', and the control signals DA_CA<0:7> and DA_RA<0:5>a nd the data DA_DQ<0:7> may be collectively defined as 'input signals'. Also, the first direct access clock DA_CLK and the first strobe signal DA_DQS may be defined as 'a first clock', and the second direct access clock DA_CLKRET and the second strobe signal DA_DQSRET may be defined as 'a second clock'.

Meanwhile, FIG. 4 shows two direct access bumps DAB1 and DAB2 and two receivers 210 and 310 that respectively correspond to the two direct access bumps DAB1 and DAB2. However, actually, there may be 16 first bumps DAB1 corresponding to the command DA_CA<0:7>, the address DA_RA<0:5>, the first direct access clock DA_CLK, and the second direct access clock DA_CLKRET, and 16 first receivers 210, and there may be 10 second bumps DAB2 corresponding to the data DA_DQ<0:7>, the first strobe signal DA_DQS, and the second strobe signal DA_DQSRET, and 10 second receivers 310 and 10 first transmitters 320. Also, in FIG. 4, although each clock signal and each strobe signal are illustrated as a one-bit signal, the concept and spirit of the present invention are not limited to this. Each of a clock signal and a strobe signal may be differential signals.

The first receiver 210 may transfer the first direct access clock DA_CLK, the second direct access clock DA_CLKRET, and the control signals DA_CA<0:7> and DA_RA<0:5>, which are provided from the external test device (not shown) through the first direct access bump DAB1, to the physical area 1142. The second receiver 310 may transfer the first strobe signal DA_DQS, the second strobe signal DA_DQSRET, and the data DA_DQ<0:7>, which are provided from the external test device through the second direct access bump DAB2, to the physical area 1142. The first transmitter 320 may output an output data DOUT_DQ<0:7> and an output strobe signal DOUT_DQS, which are transferred from the physical area 1142, to the external test device through the second direct access bump DAB2. The first receiver 210, the second receiver 310, and the first transmitter 320 may be enabled in response to a direct access mode signal DA_M which is activated in the direct access mode. According to the embodiment of the present invention, in order to perform a monitoring operation, a transmitter for outputting output control signals that are transferred from the physical area 1142 to the external test device through the first direct access bump DAB1 may be further provided.

In the TSV area 1144, a plurality of through-electrodes TSVs allocated to each of the channels CH0 to CH7 may be disposed. Meanwhile, it is illustrated in FIG. 4 that one through-electrode TSV is allocated to each of the channels CH0 to CH7. However, when each channel is 128-bit channel, through-electrodes TSVs for simultaneously inputting/outputting data of 128 bits may be disposed for each channel.

The physical area 1142 may include a plurality of first PHY bumps PB0 to PB7, a plurality of second PHY bumps PB8 to PB15, a plurality of third receivers 410_CH0 to 410_CH7, a plurality of fourth receivers 510_CH0 to 510_CH7, and a plurality of second transmitters 520_CH0 to 520_CH7. Each of the bumps, the transmitters, and the receivers may be provided as many as a number corresponding to the first to eighth channels CH0 to CH7, and they may receive the control signals, the clock, the data, and the strobe signal for the corresponding channel. For example, the first PHY bumps PB0 to PB7 and the third receivers 410_CH0 to 410_CH7 may correspond to the first to eighth channels CH0 to CH7, respectively, and input a clock PHY_CHx_CLK and control signals PHY_CHx_CA<0:7> and PHY_CHx_RA<0:5> which are provided from the memory controller 120 during a normal operation therethrough, where 'x' may refer to channel numbers 0 to 7. The second PHY bumps PB8 to PB15, the fourth receivers 510_CH0 to 510_CH7, and the second transmitters 520_CH0 to 520_CH7 may correspond to the first to eighth channels CH0 to CH7, respectively, and input/output the data PHY_CHx_DQ<0:7>and the strobe signal PHY_CHx_DQS provided from the memory controller 120 during the normal operation, where 'x' may refer to channel numbers 0 to 7.

Also, a first re-timing circuit 430, a second re-timing circuit 530, a plurality of first selectors 440_CH0 to 440 CH7, a plurality of second selectors 540_CH0 to 540_CH7, a plurality of first transfer circuits 450_CH0 to 450_CH7, a plurality of second transfer circuits 550_CH0 to 550_CH7, and a compression circuit 560 may be further disposed in the physical area 1142.

The first re-timing circuit 430 and the second re-timing circuit 530 may receive the input signals DA_CA<0:7>, DA_RA<0:5>, DA_DQ<0:7> and the first clock DA_CLK and DA_DQS, and the second clock DA_CLKRET and DA_DQSRET, and perform a re-timing operation of latching the input signals DA_CA<0:7>, DA_RA<0:5> and DA_DQ<0:7> based on the second clock DA_CLKRET and DA_DQSRET so as to output re-timed signals RDA_CA<0:7>, RDA_RA<0:5>, and RDA_DQ<0:7>. The first re-timing circuit 430 and the second re-timing circuit 530 may output replica clocks RDA_CLK and RDA_DQS by reflecting (e.g., adding or copying) a delay time of the re-timing operation into the first clock DA_CLK and DA_DQS. The re-timing operation may include a buffering operation of storing/latching and outputting the input signals DA_CA<0:7>, DA_RA<0:5> and DA_DQ<0:7> which are transferred from the direct access area 1146. When the transferred input signals DA_CA<0:7>, DA_RA<0:5> and DA_DQ<0:7> are stored/latched and outputted, the timing of the transferred input signals DA_CA<0:7>, DA_RA<0:5> and DA_DQ<0:7>may be re-aligned, and skew may be reduced. In other words, the input signals DA_CA<0:7>, DA_RA<0:5> and DA_DQ<0:7> transferred from the external test device may be re-aligned so as to improve the reliability of the stacked memory device 110.

To be specific, the first re-timing circuit 430 may receive the control signals DA_CA<0:7> and DA_RA<0:5>, the first direct access clock DA_CLK, and the second direct access clock DA_CLKRET that are transferred from the first receiver 210 of the direct access area 1146. The first re-timing circuit 430 may perform a re-timing operation of latching the control signals DA_CA<0:7> and DA_RA<0:5> based on the second direct access clock DA_CLKRET to output re-timed control signals RDA_CA<0:7> and RDA_RA<0:5>. The first re-timing circuit 430 may output the replica dock RDA_CLK by reflecting the delay time of the re-timing operation into the first direct access clock DA_CLK.

The second re-timing circuit 530 may receive the data DA_DQ<0:7>, the first strobe signal DA_DQS, and the second strobe signal DA_DQSRET that are transferred from the second receiver 310 of the direct access area 1146. The second re-timing circuit 530 may perform a re-timing operation of latching the data DA_DQ<0:7> based on the second strobe signal DA_DQSRET to output re-timed data RDA_DQ<0:7>. The second re-timing circuit 530 may reflect the delay time of the re-timing operation into the first strobe signal DA_DQS to output the replica strobe signal RDA_DQS.

The first selectors 440_CH0 to 440_CH7 may be provided as many as a number corresponding to the first to eighth channels CH0 to CH7, and select one among the re-timed control signals RDA_CA<0:7> and RDA_RA<0:5> and the replica clock RDA_CLK which are provided from the first re-timing circuit 430, and the control signals PHY_CHx_CA<0:7> and PHY_CHx_RA<0:5> and the clock PHY_CHx_CLK which are provided from the third receivers 410_CH0 to 410_CH7, in response to the direct access mode signal DA_M. When the direct access mode signal DA_M is activated, the first selectors 440_CH0 to 440_CH7 may select the re-timed control signals RDA_CA<0:7> and RDA_RA<0:5> and the replica clock RDA_CLK that are provided from the first re-timing circuit 430.

The first transfer circuits 450_CH0 to 450_CH7 may be provided as many as a number corresponding to the first to eighth channels CH0 to CH7, and transfer the output signals of the first selectors 440_CH0 to 440_CH7 to the through-electrodes TSVs of the TSV area 1144, which are allocated to a corresponding channel. The first transfer circuits 450_CH0 to 450_CH7 may transfer the re-timed control signals RDA_CA<0:7> and RDA RA<0:5> to the TSV area 1144 based on the replica clock RDA_CLK in the direct access mode. The first transfer circuits 450_CH0 to 450_CH7 may transfer the control signals PHY_CHx_CA<0:7> and PHY_CHx_RA<0:5> to the TSV area 1144 based on the clock PHY_CHx_CLK in the normal mode. The first transfer circuits 450_CH0 to 450_CH7 may include flip-flops, respectively.

The second selectors 540_CH0 to 540_CH7 may be provided as many as a number corresponding to the first to eighth channels CH0 to CH7, and select one among the re-timed data RDA_DQ<0:7> and the replica strobe signal RDA_DQS, which are provided from the second re-timing circuit 530, and the data PHY_CHx_DQ<0:7> and the strobe signal PHY_CHx_DQS, which are provided from the fourth receivers 510_CH0 to 510_CH7, in response to the direct access mode signal DA_M. When the direct access mode signal DA_M is activated, the second selectors 540_CH0 to 540_CH7 may select the re-timed data RDA-DQ<0:7>and the replica strobe signal RDA_DQS that are provided from the second re-timing circuit 530.

The second transfer circuits 550_CH0 to 550_CH7 may be provided as many as a number corresponding to the first to eighth channels CH0 to CH7 and transfer output signals of the second selectors 540_CH0 to 540_CH7 to the through-electrodes TSVs of the TSV area 1144, which are allocated to a corresponding channel. The second transfer circuits 550_CH0 to 550_CH7 may transfer the re-timed data RDA_DQ<0:7> to the TSV area 1144 in the direct access mode based on the replica strobe signal RDA_DQS. The first transfer circuits 450_CH0 to 450_CH7 may copy the re-timed data RDA_DQ<0:7> 16 times and transfer the same as the channel data CHx_DQ<0:127> in the direct access mode. The second transfer circuits 550_CH0 to 550_CH7 may transfer the data PHY_CHx_DQ<0:7> to the TSV area 1144 based on the strobe signal PHY_CHx_DQS in the normal mode. The second transfer circuits 550_CH0 to 550_CH7 may include flip-flops, respectively.

The compression circuit 560 may compress the channel data CHx_DQ<0:127> and the strobe signal CHx_DQS that are transferred through the through-electrodes TSVs of the TSV area 1144 to generate the output data DOUT_DQ<0:7> and the output strobe signal DOUT_DQS, where 'x' may refer to channel numbers 0 to 7. The compression circuit 560 may transfer the output data DOUT_DQ<0:7> and the output strobe signal DOUT_DQS directly to the first transmitter 320 of the direct access area 1146.

Figure 5:
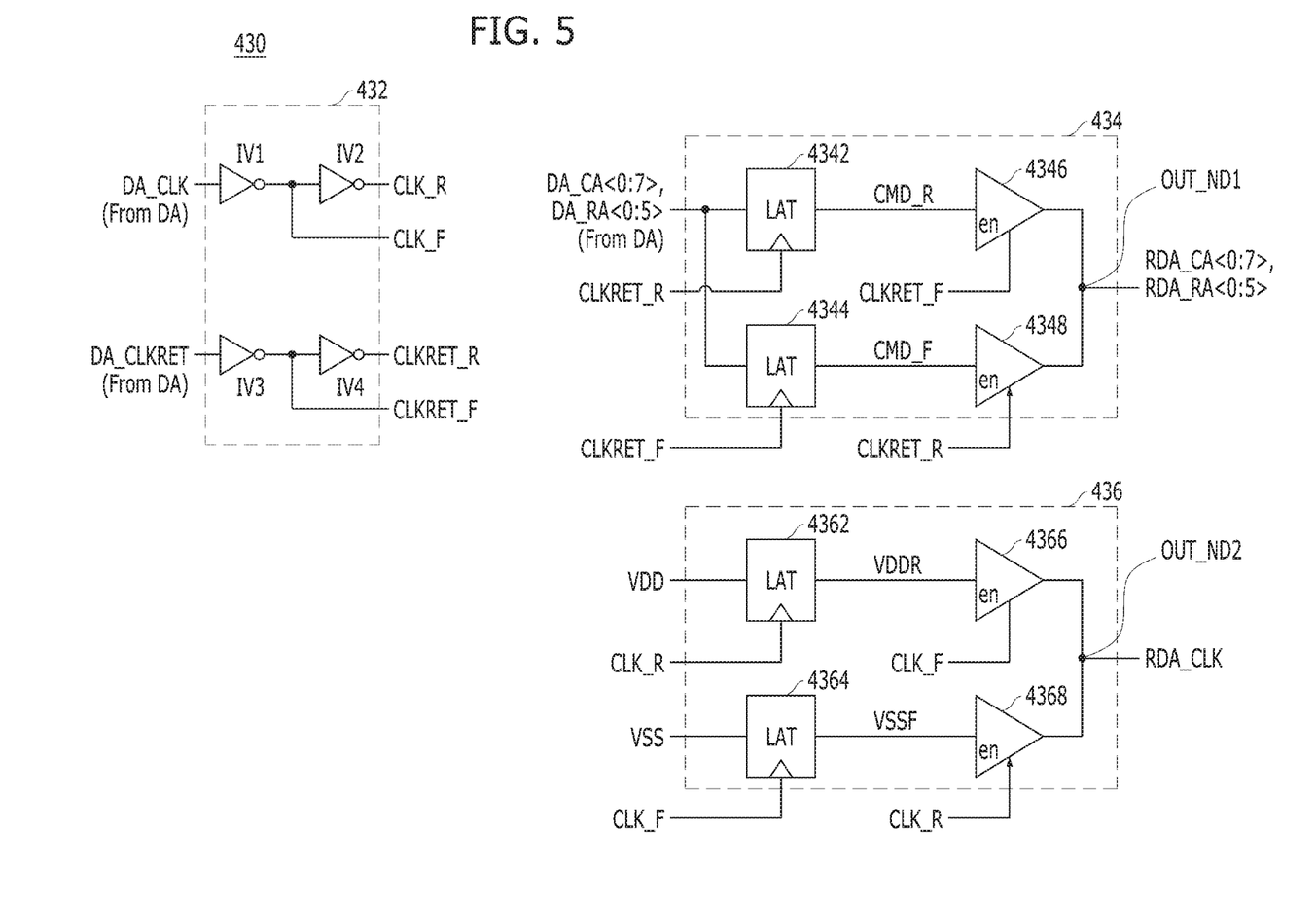
FIG. 5 is a detailed circuit diagram of a first re-timing circuit shown in FIG. 4.

FIG. 5 is a detailed circuit diagram of the first re-timing circuit 430 shown in FIG. 4.

Referring to FIG. 5, the first re-timing circuit 430 may include a first clock generation unit 432, a first alignment unit 434, and a first replica unit 436. The first alignment unit 434 may correspond to one bit of the control signals DA_CA<0:7> and DA_RA<0:5>, and the first re-timing circuit 430 may include a plurality of first alignment units 434 respectively corresponding to bits of the control signals DA_CA<0:7> and DA_RA<0:5>.

The first clock generation unit 432 may generate a first rising clock CLK_R and a first falling clock CLK_F according to a rising edge and a falling edge of the first direct access clock DA_CLK. The first clock generation unit 432 may generate a second rising clock CLKRET_R and a second falling clock CLKRET_F according to a rising edge and a falling edge of the second direct access clock DA_CLKRET.

To be specific, the first clock generation unit 432 may include first to fourth inverters IV1 to IV4. The first inverter IV1 may invert the first direct access clock DA_CLK to generate the first falling clock CLK_F, and the second inverter IV2 may invert the first falling clock CLK_F to output the first rising clock CLK_R. The third inverter IV3 may invert the second direct access clock DA_CLKRET to generate the second falling clock CLKRET_F, and the fourth inverter IV4 may invert the second falling clock CLKRET_F to output the second rising clock CLKRET_R.

The first alignment unit 434 may latch the control signals DA_CA<0:7> and DA_RA<0:5> based on the second rising clock CLKRET_R and the second falling clock CLKRET_F, and output re-timed control signals RDA_CA<0:7> and RDA_RA<0:5> by driving a first output node OUT_ND1 based on the latched control signals.

To be more specific, the first alignment unit 434 may include a first latch 4342, a second latch 4344, a first driver 4346, and a second driver 4348. The first latch 4342 may latch the control signals DA_CA<0:7> and DA_RA<0:5> based on the second rising clock CLKRET_R to output a rising signal CMD_R. In other words, the first latch 4342 may latch the control signals DA_CA<0:7> and DA_RA<0:5> during an activation section of the second rising clock CLKRET_R to output the rising signal CMD_R. The second latch 4344 may latch the control signals DA_CA<0:7> and DA_RA<0:5> based on the second falling clock CLKRET_F to output a falling signal CMD_F. That is, the second latch 4344 may latch the control signals DA_CA<0:7> and DA_RA<0:5> during an activation section of the second falling clock CLKRET_F to output the falling signal CMD_F. The first driver 4346 may be enabled in response to the second falling clock CLKRET_F and may drive the first output node OUT_ND1 based on the rising signal CMD_R. The second driver 4348 may be enabled in response to the second rising clock CLKRET_R and may drive the first output node OUT_ND1 based on the falling signal CMD_F. That is, the re-timed control signals RDA_CA<0:7> and RDA_RA<0:5> may be outputted through the first output node OUT_ND1 which is driven by the first driver 4346 and the second driver 4348.

The first replica unit 436 may latch a signal having a level of a power source voltage VDD and a signal having a level of a ground voltage VSS based on the first rising clock CLK_R and the first falling clock CLK_F, and may drive a second output node OUT_ND2 based on the latched signals to output the replica clock RDA_CLK. For reference, the signal having the level of the power source voltage VDD and the signal having the level of the ground voltage VSS may be used to re-time a clock signal, i.e., the first direct access clock DA_CLK, in the first replica unit 436.

More specifically, the first replica unit 436 may include a third latch 4362, a fourth latch 4364, a third driver 4366, and a fourth driver 4368.

The third latch 4362 may latch the signal having a level of the power source voltage VDD based on the first rising clock CLK_R to output a rising clock signal VDDR. In other words, the third latch 4362 may latch the signal having a level of the power source voltage VDD during the activation section of the first rising clock CLK_R to output the rising clock signal VDDR. The fourth latch 4364 may latch the signal having a level of the ground voltage VSS based on the first falling clock CLK_F to output a falling clock signal VSSF. In other words, the fourth latch 4364 may latch the ground voltage VSS level signal during the activation section of the first falling clock CLK_F to output the falling clock signal VSSF. The third driver 4366 may be enabled based on the first falling clock CLK_F, and may drive the second output node OUT_ND2 based on the rising clock signal VDDR. The fourth driver 4368 may be enabled based on the first rising clock CLK_R and may drive the second output node OUT_ND2 based on the falling clock signal VSSF. In other words, the replica clock RDA_CLK may be outputted through the second output node OUT_ND2 which is driven by the third driver 4366 and the fourth driver 4368.

Figure 6:
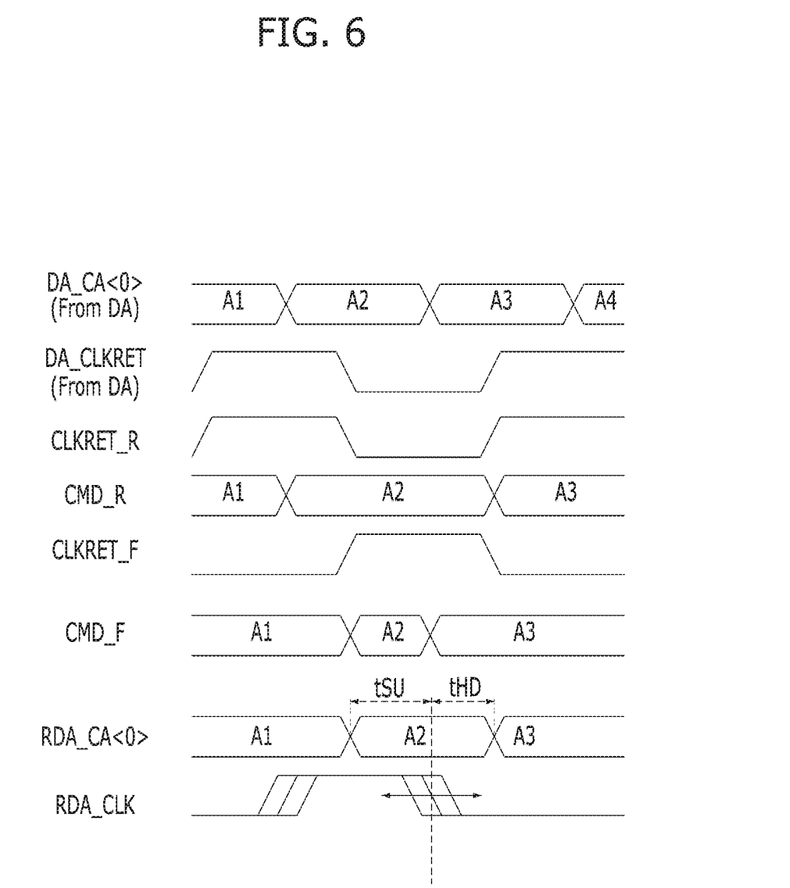
FIG. 6 is a timing diagram for describing an operation of the first re-timing circuit shown in FIG. 5.

FIG. 6 is a timing diagram for describing an operation of the first re-timing circuit 430 shown in FIG. 5.

Referring to FIG. 6, the first clock generation unit 432 may generate the second rising clock CLKRET_R and the second falling clock CLKRET_F according to the rising edge and falling edge of the second direct access clock DA_CLKRET. Herein, the second direct access clock signal DA_CLKRET may be a clock signal having a predetermined phase difference from the first direct access clock signal DA_CLK.

The first latch 4342 of the first alignment unit 434 may latch a control signal (e.g., DA_CA<0>) and output the rising signal CMD_R during the activation section of the second rising clock CLKRET_R. The second latch 4344 may latch the control signal DA_CA<0> and output the falling signal CMD_F during the activation section of the second falling clock CLKRET_F. The first driver 4346 may output the rising signal CMD_R to the first output node OUT_ND1 during the activation section of the second falling clock CLKRET_F, and the second driver 4348 may output the falling signal CMD_F to the first output node OUT_ND1 during the activation section of the second rising clock CLKRET_R. Therefore, the re-timed control signal (e.g., RDA_CA<0>) may be outputted through the first output node OUT_ND1.

Meanwhile, the first replica unit 436 may latch the signal having a level of the power source VDD and the signal having a level of the ground voltage VSS based on the first rising clock CLK_R and the first falling clock CLK_F, and output the replica clock RDA_CLK by driving the second output node OUT_ND2 based on the latched signals. Herein, the first replica unit 436 of the first re-timing circuit 430 may have substantially the same structure as that of the first alignment unit 434. Therefore, the first replica unit 436 may generate the replica clock RDA_CLK by reflecting a delay time used for the re-timing operation of the first alignment unit 434 into the first direct access clock DA_CLK. In other words, the first replica unit 436 may re-time the first direct access clock DA_CLK and output it as the replica clock RDA_CLK.

Subsequently, the first transfer circuits 450_CH0 to 450_CH7 may latch the re-timed control signal RDA_CA<0> based on the replica clock RDA_CLK.

As described above, in the proposed invention, the effective window of input signals DA_CA<0:7>, DA_RA<0:5> and DA_DQ<0:7> may be extended by using the re-timing circuit 430, and the input signals DA_CA<0:7>, DA_RA<0:5> and DA_DQ<0:7> and the clock DA_CLK may be adjusted to be delayed by substantially the same delay amount by using the replica circuit (i.e., the first replica unit 436) so as to secure setup/hold margin (tSU/tHD) of the input signals DA_CA<0:7>, DA_RA<0:5> and DA_DQ<0:7> and eliminate the skew between the input signals DA_CA<0:7>, DA_RA<0:5> and DA_DQ<0:7> and the clock DA_CLK, which occurs while the input signals DA_CA<0:7>, DA_RA<0:5> and DA_DQ<0:7> and the clock DA_CLK are transferred from the direct access area 1146 to the physical area 1142.

Figure 7:
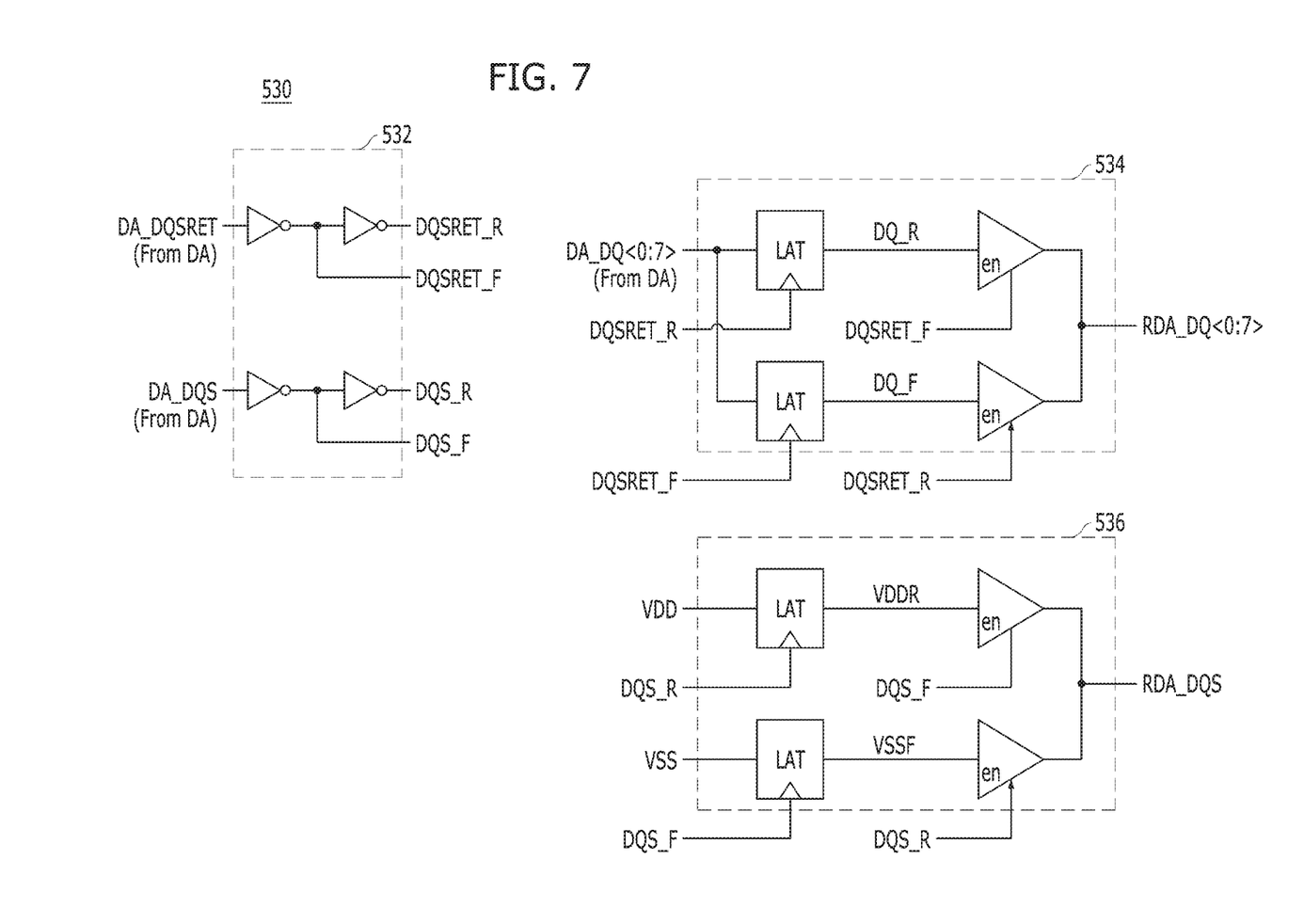
FIG. 7 is a detailed circuit diagram of a second re-timing circuit shown in FIG. 4.

FIG. 7 is a detailed circuit diagram of the second re-timing circuit 530 shown in FIG. 4.

Referring to FIG. 7, the second re-timing circuit 530 may include a second clock generation unit 532, a second alignment unit 534, and a second replica unit 536. Since each of the constituent elements of the second re-timing circuit 530 has substantially the same structure as that of the first re-timing circuit 430 except for the input/output signals, detailed description thereof will be omitted herein.

Figure 8:
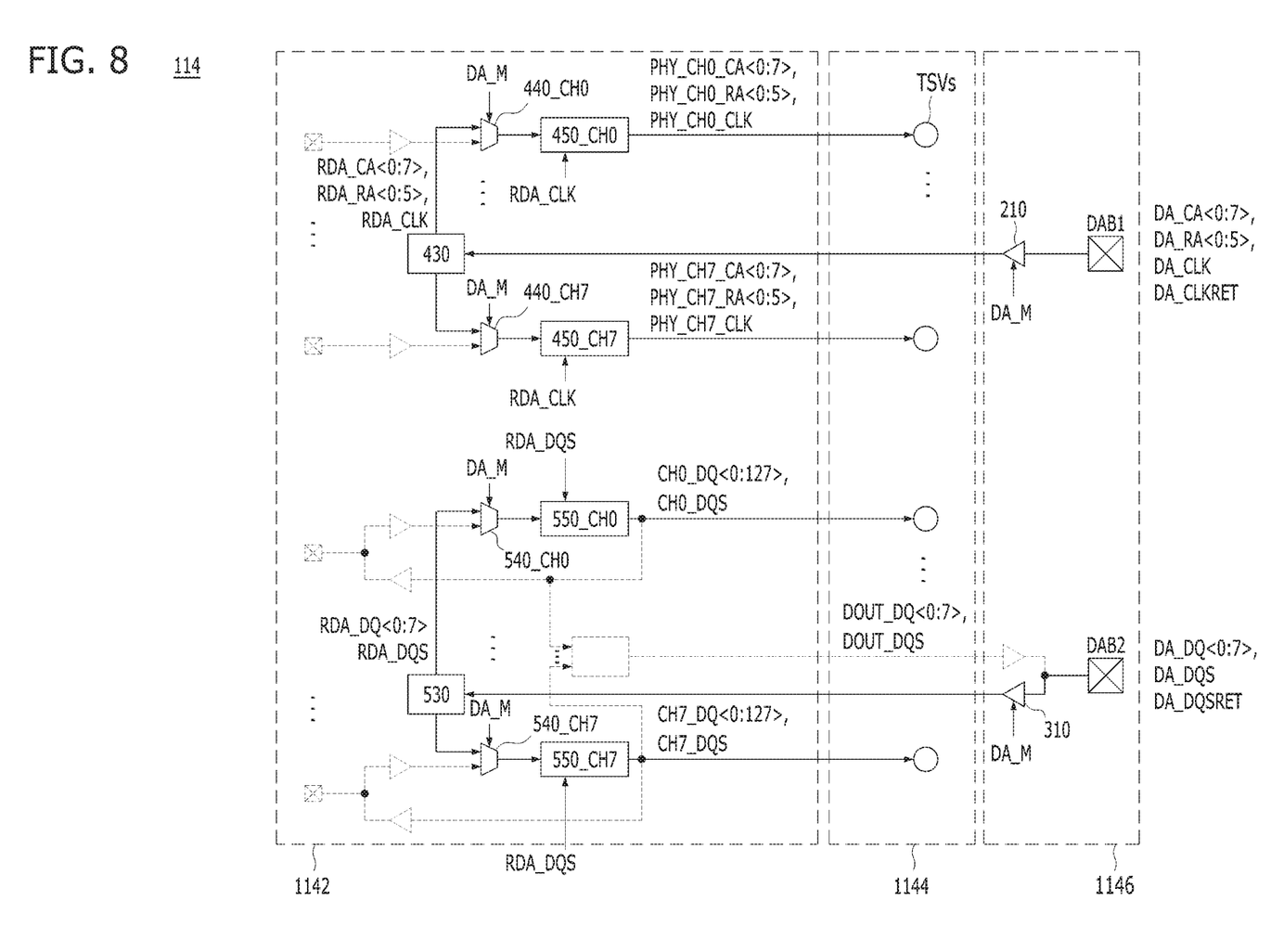
FIGS. 8 and 9 are schematic diagrams for describing an operation of the base logic die shown in FIG. 4 in a direct access mode.
Figure 9:
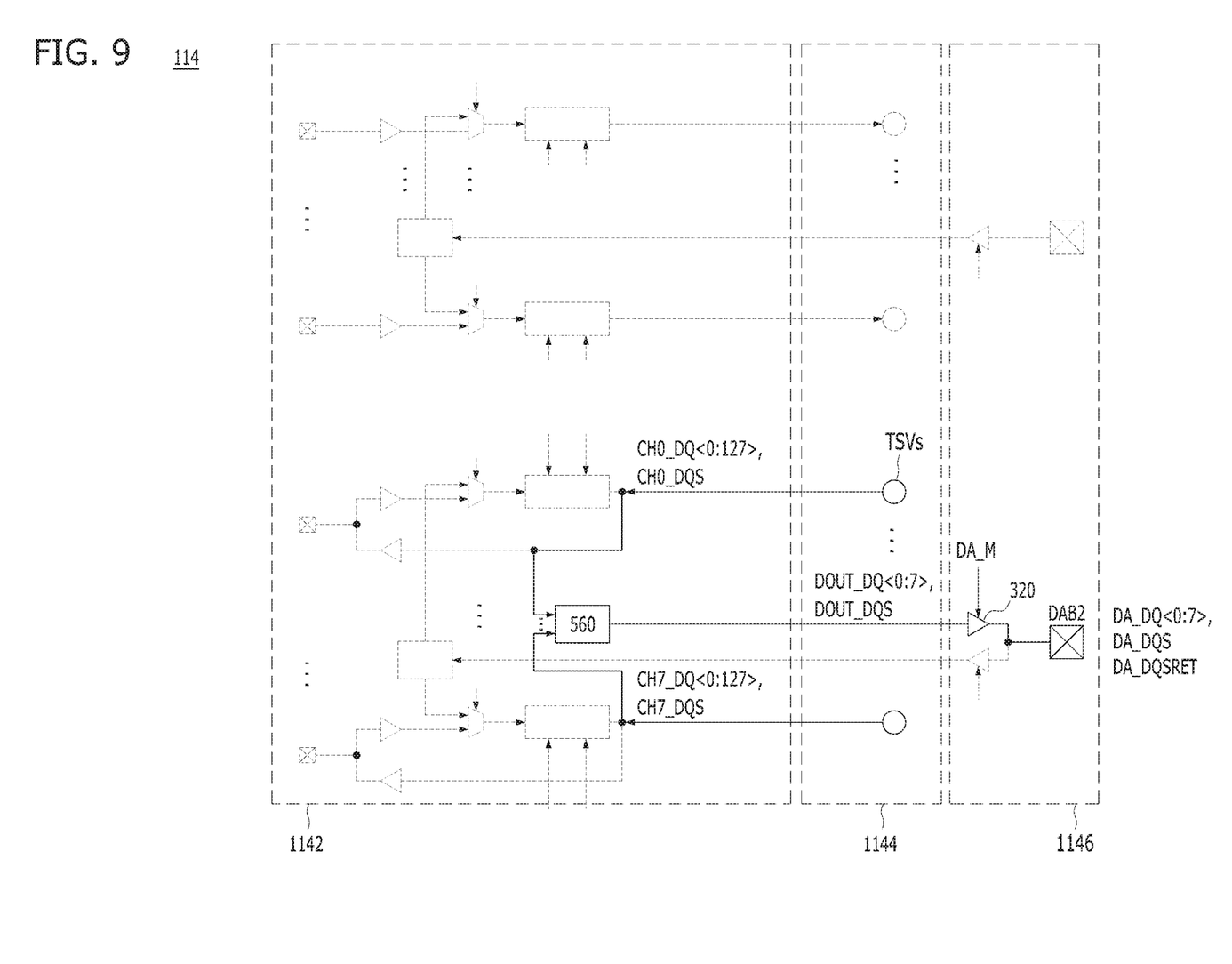

FIGS. 8 and 9 are block diagrams for describing an operation of the base logic die shown in FIG. 4 in a direct access (DA) mode. FIG. 8 shows an input operation during the direct access mode, whereas FIG. 9 shows an output operation during the direct access mode.

Referring to FIG. 8, the direct access mode signal DA_M may be activated upon entering the direct access mode. The first receiver 210 of the direct access (DA) area 1146 may transfer the control signals DA_CA<0:7>, the address DA_RA<0:5>, the first direct access clock DA_CLK, and the second direct access clock DA_CLKRET that are inputted through the first direct access bumps DAB1 from the external test device to the physical area 1142 based on the direct access mode signal DA_M.

The first re-timing circuit 430 of the physical area 1142 may receive the control signals DA_CA<0:7> and DA_RA<0:5>, the first direct access clock DA_CLK, and the second direct access clock DA_CLKRET that are transferred from the first receiver 210. The first re-timing circuit 430 may output the re-timed control signals RDA_CA<0:7> and RDA_RA<0:5> by re-timing the control signals DA_CA<0:7> and DA_RA<0:5> and output the replica clock RDA_CLK by re-timing the first direct access clock DA_CLK based on the second direct access clock DA_CLKRET.

The first selectors 440_CH0 to 440_CH7 may select and output the re-timed control signals RDA_CA<0:7> and RDA_RA<0:5> and the replica clock RDA_CLK based on the direct access mode signal DA_M. The first transfer circuits 450_CH0 to 450_CH7 may transfer the re-timed control signals RDA_CA<0:7> and RDA_RA<0:5> to the TSV area 1144 based on the replica clock RDA_CLK.

Each of the core dies may receive the control signals CHx_CA<0:7> and CHx_RA<0:5>, the clock CHx_CLK, the channel data CHx_DQ<0:5>, and the strobe signal CHx_DQS that are transferred through the through-electrodes TSVs that are respectively assigned to the channels and perform an internal test operation so as to produce a test result. Each of the core dies may transfer the test result to the TSV area 1144 of the base logic die 114 through the through-electrodes TSVs.

Referring to FIG. 9, the compression circuit 560 may generate the output data DOUT_DQ<0:7> and the output strobe signal DOUT_DQS by compressing the channel data CHx_DQ<0:127> and the strobe signal CHx_DQS transferred through the through-electrodes TSVs of the TSV area 1144, and transfer the generated output data DOUT_DQ<0:7> and the generated output strobe signal DOUT_DQS to the first transmitter 320 of the direct access area 1146. The first transmitter 320 may output the output data DOUT_DQ<0:7> and the output strobe signal DOUT_DQS, which are transferred from the physical area 1142, to the external test device through the second direct access bumps DAB2.

As described above, in the embodiment of the present invention, a re-timing operation for storing/latching the input signals DA_CA<0:7>, DA_RA<0:5> and DA_DQ<0:7>, which are transferred from the direct access area 1146 may be performed, and a re-timing operation that is substantially the same as the re-timing operation may be applied to the clock/strobe signal DA_CLK and DA_DQS. Subsequently, the skew between the input signals DA_CA<0:7>, DA_RA<0:5> and DA_DQ<0:7>, which are transferred from the direct access area 1146, and the clock/strobe signal DA_CLK and DA_DQS may be eliminated by transferring the re-timed signals RDA_CA<0:7>, RDA_RA<0:5>, and RDA_DQ<0:7> based on the re-timed clock/strobe signal RDA_CLK and RDA_DQS. Therefore, signals may be transferred at the exact timing between the direct access area 1146 and the physical area 1142.

According to the embodiments of the present invention, the stacked memory device may improve the reliability of the semiconductor device by re-timing the signals externally provided in a direct access mode.

While the present invention has been described with respect to the specific embodiments, it will be apparent to those skilled in the art that various changes and modifications may be made without departing from the spirit and scope of the invention as defined in the following claims.

For example, the logic gates and transistors illustrated in the above embodiments may have different positions and types according to the polarity of input signals.

What is claimed is:

1. A stacked memory device, comprising:
 a plurality of semiconductor chips that are stacked and transfer signals through a plurality of through-electrodes,
 wherein at least one of the semiconductor chips comprises:
  a re-timing circuit suitable for receiving input signals and first and second clocks, performing a re-timing operation of latching the input signals based on the second clock to output re-timed signals, and reflecting a delay time of the re-timing operation into the first clock to output a replica clock; and
  a transfer circuit suitable for transferring the re-timed signals to the through-electrodes based on the replica clock.

2. The stacked memory device of claim 1,
 wherein each of the semiconductor chips includes a first area suitable for interfacing with a memory controller, a second area suitable for interfacing with the through-electrodes, and a third area suitable for directly interfacing with an external device, and
 wherein the re-timing circuit and the transfer circuit are disposed in the first area to receive the input signals and the first and second clocks, which are transmitted from the third area, and to transfer the re-timed signals to the second area.

3. The stacked memory device of claim 2, wherein the first area is disposed in a first edge area which is adjacent to the memory controller, and the third area is disposed in a second edge area which is opposite to the first edge area, and the second area is disposed between the first area and the third area.

4. The stacked memory device of claim 2,
 further comprising:
 a plurality of first bumps disposed in the first area, for interfacing with the memory controller; and
 a plurality of second bumps disposed in the third area,
  wherein the second bumps are larger than the first bumps in size and directly interface with the external device.

5. The stacked memory device of claim 2,
 wherein each of the semiconductor chips includes at least one channel, and
 wherein the first area includes channel interface areas respectively corresponding to the channels of the semiconductor chips.

6. The stacked memory device of claim 5, further comprising a compression circuit disposed in the first area, and suitable for compressing channel data transferred from the through-electrodes and transferring the compressed data to the third area.

7. The stacked memory device of claim 6, further comprising:
 a receiver disposed in the third area, and suitable for transferring the input signals and the first and second clocks, which are provided from the external device, to the re-timing circuit; and
 a transmitter disposed in the third area, and suitable for outputting the compressed data transferred from the compression circuit to the external device through a plurality of bumps.

8. The stacked memory device of claim 1, wherein the re-timing circuit includes:
 a clock generation unit suitable for generating a first rising clock and a first falling clock based on a rising edge and a falling edge of the first clock, and generating a second rising clock and a second falling clock based on a rising edge and a falling edge of the second clock;
 an alignment unit suitable for latching the input signals based on the second rising clock and the second falling clock, driving a first output node based on the latched input signals to output the re-timed signals; and
 a replica unit suitable for latching a power source level signal and a ground voltage level signal based on the first rising clock and the first falling clock, and driving a second output node based on the latched signals to output the replica clock.

9. The stacked memory device of claim 8, wherein the alignment unit includes:
 a first latch suitable for latching the input signals based on the second rising clock and outputting rising signals;
 a second latch suitable for latching the input signals based on the second falling clock and outputting falling signals;
 a first driver that is enabled based on the second falling clock and driving the first output node based on the rising signals; and
 a second driver that is enabled based on the second rising clock and driving the first output node based on the falling signals.

10. The stacked memory device of claim 8, wherein the replica unit includes:

a third latch suitable for latching the power source level signal based on the first rising clock and outputting a rising clock signal;

a fourth latch suitable for latching the ground voltage level signal based on the first falling clock and outputting a falling clock signal;

a third driver that is enabled based on the first falling clock and driving the second output node based on the rising clock signal; and a fourth driver that is enabled based on the first rising clock and driving the second output node based on the falling clock signal.

11. A memory system, comprising:

a stacked memory device including a plurality of semiconductor chips that are stacked and transfer signals through a plurality of through-electrodes; and a memory controller including an interface suitable for transferring/receiving data with the semiconductor chips, wherein at least one of the semiconductor chips comprises:

a re-timing circuit suitable for receiving input signals and first and second clocks, performing a re-timing operation of latching the input signals based on the second clock to output re-timed signals, and reflecting a delay time of the re-timing operation into the first clock to output a replica clock; and a transfer circuit suitable for transferring the re-timed signals to the through-electrodes based on the replica clock.

12. The memory system of claim 11, wherein each of the semiconductor chips includes a first area suitable for interfacing with the memory controller, a second area suitable for interfacing with the through-electrodes, and a third area suitable for directly interfacing with an external device, and wherein the re-timing circuit and the transfer circuit are disposed in the first area to receive the input signals and the first and second clocks, which are transmitted from the third area, and to transfer the re-timed signals to the second area.

13. The memory system of claim 12, further comprising an interposer suitable for coupling the first area of the semiconductor chip and the interface of the memory controller to each other.

14. The memory system of claim 12, wherein each of the semiconductor chips includes at least one channel, and further comprising a compression circuit disposed in the first area, and suitable for compressing channel data transferred from the through-electrodes and transferring the compressed data to the third area.

15. The memory system of claim 14, further comprising:

a receiver disposed in the third area, and suitable for transferring the input signals and the first and second clocks, which are provided from the external device, to the re-timing circuit; and a transmitter disposed in the third area, and suitable for outputting the compressed data transferred from the compression circuit to the external device through a plurality of bumps.

16. The memory system of claim 11, wherein the re-timing circuit includes:

a clock generation unit suitable for generating a first rising clock and a first falling clock based on a rising edge and a falling edge of the first clock, and generating a second rising clock and a second falling clock based on a rising edge and a falling edge of the second clock;

an alignment unit suitable for latching the input signals based on the second rising clock and the second falling clock, driving a first output node based on the latched input signals to output the re-timed signals; and a replica unit suitable for latching a power source level signal and a ground voltage level signal based on the first rising clock and the first falling clock, and driving a second output node based on the latched signals to output the replica clock.

17. The memory system of claim 16, wherein the alignment unit includes:

a first latch suitable for latching the input signals based on the second rising clock and outputting rising signals;

a second latch suitable for latching the input signals based on the second falling clock and outputting falling signals;

a first driver that is enabled based on the second falling clock and driving the first output node based on the rising signals; and a second driver that is enabled based on the second rising clock and driving the first output node based on the falling signals.

18. The memory system of claim 16, wherein the replica unit includes:

a third latch suitable for latching the power source level signal based on the first rising clock and outputting a rising clock signal;

a fourth latch suitable for latching the ground voltage level signal based on the first falling clock and outputting a falling clock signal;

a third driver that is enabled based on the first falling clock and driving the second output node based on the rising clock signal; and a fourth driver that is enabled based on the first rising clock and driving the second output node based on the falling clock signal.

19. A method for operating a stacked memory device including a plurality of semiconductor chips that are stacked and transfer signals through a plurality of through-electrodes, the method comprising:

receiving input signals and first and second clocks in at least one of the semiconductor chips;

outputting re-timed signals by performing a re-timing operation of latching the input signals based on the second;

outputting a replica clock by reflecting a delay time of the re-timing operation into the first clock; and transferring the re-timed signals to the through-electrodes based on the replica clock.

20. The method of claim 19, wherein each of the semiconductor chips includes a first area suitable for interfacing with a memory controller, a second area suitable for interfacing with the through-electrodes, and a third area suitable for directly interfacing with an external device, and wherein the input signals and the first and second docks are transmitted from the third area, and the re-timing operation is performed in the first area.

21. A semiconductor apparatus comprising:

a re-timing circuit configured to align an input signal, which is originally in synchronization with a first clock, based on a second clock and delay the first clock by an amount of time for the aligning of the input signal; and an output circuit configured to output the aligned input signal in synchronization with the delayed first clock, wherein the first and second clocks have a single period with a variable phase difference.

* * * * *